United States Patent [19]
Mohri et al.

[11] Patent Number: 5,446,377
[45] Date of Patent: Aug. 29, 1995

[54] MAGNETIC DETECTOR USING MATTEUCCI EFFECT

[75] Inventors: Kaneo Mohri, Nagoya; Mitsunari Kano, Seto; Toshihiko Matsuda, Owariasahi; Jiro Kino, Seto; Morihiko Takashi; Yoshiharu Konishi, both of Owariasahi; Junichi Oizumi, Ibaraki, all of Japan

[73] Assignee: Hitachi, Ltd., Tokyo, Japan

[21] Appl. No.: 118,764

[22] Filed: Sep. 10, 1993

Related U.S. Application Data

[62] Division of Ser. No. 797,923, Nov. 26, 1991, Pat. No. 5,298,689.

[30] Foreign Application Priority Data

Nov. 28, 1990 [JP] Japan ................. 2-322964
Nov. 28, 1990 [JP] Japan ................. 2-322965
Jan. 29, 1991 [JP] Japan ................. 3-008921

[51] Int. Cl.$^6$ .......................... G01B 7/14
[52] U.S. Cl. .................. 324/207.13; 324/207.26
[58] Field of Search .............. 324/207.11, 207.13, 324/207.26

[56] References Cited

U.S. PATENT DOCUMENTS 4,418,242 11/1983 Kouno .
4,963,703 10/1990 Phillips et al. .

FOREIGN PATENT DOCUMENTS 187372 7/1986 European Pat. Off. .
2087205 12/1971 France .
3843087 6/1989 Germany .

OTHER PUBLICATIONS

IEEE Transactions on Magnetics., vol. 27, No. 6, Nov. 1991, New York, US, pp. 48-61-4863, K. Kimura et al, "Data Tablet Utilizing Matteucci Effect of Amorphous Magnetic Wire".

IEEE Transactions on Magnetics., vol. 26, No. 5, Sep. 1990, New York, US, pp. 1789-1791, K. Mohri et al, "Large Barkhausen and Matteucci Effects in FeCoSiB, FeCrSiB and FeNiSiB".

IEEE Transactions on Magnetics., vol. 11, No. 5, Sep. 1975, New York, US, pp. 1403-1404, P. E. Gise et al, "An Electrodeposited Cylindrical Magnetometer Sensor".

Elektor Electronics, vol. 12, No. 5, May 1986, Canterbury, GG, pp. 52-53, "Magnetic-Field Sensors".

Primary Examiner—Walter E. Snow
Attorney, Agent, or Firm—Antonelli, Terry, Stout & Kraus

[57] ABSTRACT

A magnetic detector for detecting a magnetism present in the vicinity of or close to a magnetic wire circumferentially magnetized therein and an electromagnet for generating an A.C. magnetic field on the basis of the magnitude of a Matteucci-effect voltage developed across the magnetic wire when the electromagnet approaches the magnetic wire. A coordinate input device for detecting proximity between the electromagnet and an array of a plurality of such magnetic wires arranged in X and Y directions when the electromagnet approaches the array. A magnetic image sensor for detecting an intensity distribution of a static magnetic field to be detected and present along a longitudinal direction of the wire on the basis of a detection voltage of the wire when a plurality of such electromagnets arranged along the longitudinal direction of the wire are sequentially excited one after another.

22 Claims, 9 Drawing Sheets

ELECTROMAGNET
MAGNETIC FIELD
FOR COORDINATE
DESIGNATION

PULSE VOLTAGE
ON MAGNETIC WIRE

MATTEUCCI-EFFECT VOLTAGE/DISTANCE CHARACTERISTIC $V_{N+1}/V_N$ CHARACTERISTIC

MAGNETIC DETECTOR USING MATTEUCCI EFFECT

This is a division of application Ser. No. 07/797,923, filed Nov. 26, 1991, now U.S. Pat. No. 5,298,689.

BACKGROUND OF THE INVENTION

The present invention relates to a magnetic detector, a coordinate input device and a magnetic image sensor using Matteucci effect.

When circumferential magnetization is provided to the interior of a single magnetic wire and external A.C. magnetic field is applied to the wire in the transverse direction thereof, a pulsative voltage is developed across the wire, that is, a so-called Mattecci effect takes place. Such Matteucci effect is known but its substantially no application techniques are known.

Further, as a digitizer or a coordinate input device for inputting handwritten letters, such a prior art device as shown in JP-A-61-70628 is known, but such a coordinate input device based on the aforementioned Matteucci effect is not known so far.

Meanwhile, a prior art magnetic image sensor for detecting magnetic data on a multi-track of a magnetic card or the like or a magnetic field caused by a magnetic material film uses a gap type magnetic head of multichannel, a magnetic resistive element array, a Hall-effect element array, or the like. Thus, the prior art magnetic image sensor has been defective in that the magnetic image sensor is expensive and requires the number of detection circuits corresponding to the multichannel and thus its necessary circuit is increased in size.

SUMMARY OF THE INVENTION

It is therefore an object of the present invention to provide a magnetic detector, a coordinate input device and a magnetic image sensor all based on Matteurcci effect.

In accordance with an coordinate input device of the present invention, a plurality of magnetic wires circumferentially magnetized therein are arranged to form a wire array and, when a coordinate designator for generating an A.C. magnetic field is moved close to the wire array, a coordinate position of the designator on the wire array is calculated and found on the basis of a mutual relationship between pulse voltages developed across the respective magnetic wires.

In accordance with a magnetic image sensor of the present invention, a plurality of exciting coils for generating a predetermined A.C. magnetic field are arranged along a magnetic wire circumferentially magnetized therein and a static magnetic field to be image-detected is positioned along the wire, so that its magnetic image is detected on the basis of the magnitude of a pulse voltage developed across the wire when the exciting coils are sequentially excited one after another.

DESCRIPTION OF THE PREFERRED EMBODIMENTS

Figure 1:
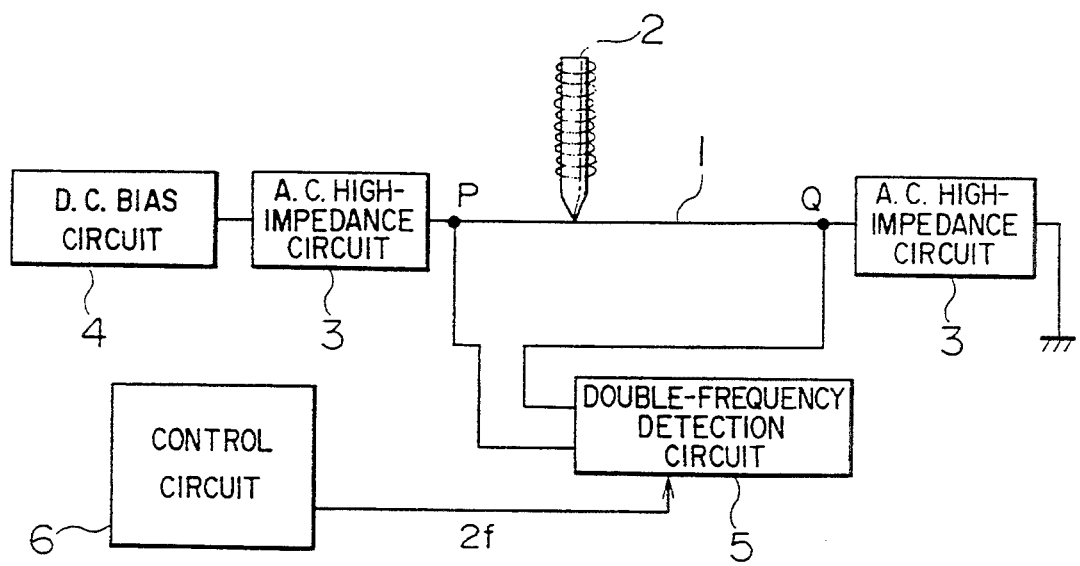
FIG. 1 is a schematic block diagram of a signal detector which forms a major part of a coordinate input device in accordance with the present invention.

Referring to FIG. 1, there is shown a signal detecting section of a coordinate input device in accordance with the present invention, wherein a magnetic wire 1 is used as a coordinate detector and an A.C. magnetic field is applied to a coordinate designator through the magnetic wire 1 and an electromagnet 2 for coordinate designation (or coordinate designator 2). A D.C. bias circuit 4 is provided to pass a D.C. current through the magnetic wire 1 to provide a circumferential magnetization therein. When the D.C. bias circuit 4 is connected to the magnetic wire 1 through a wiring line, this causes the impedance of the magnetic wire 1 at its both ends to be reduced, thus reducing a pulse voltage to be developed in the magnetic wire 1. For the purpose of avoiding such impedance reduction, an A.C. high impedance circuit 3 is provided to at least one end of the magnetic wire 1. The pulse voltage thus developed in the magnetic wire 1 and appears at both ends P and Q of the magnetic wire 1. The pulse voltage is detected by a double-frequency detecting circuit 5 with respect to its 2f component. The double-frequency detecting circuit 5 may comprise an ordinary resonance circuit, filter circuit or synchronous detector circuit. A control circuit 6 functions to supply an exciting current having a fundamental frequency if to the electromagnet 2 for coordination designation and also to supply a control signal having a fundamental frequency 2f to the double-frequency detecting circuit 5 as necessary.

Figure 2:
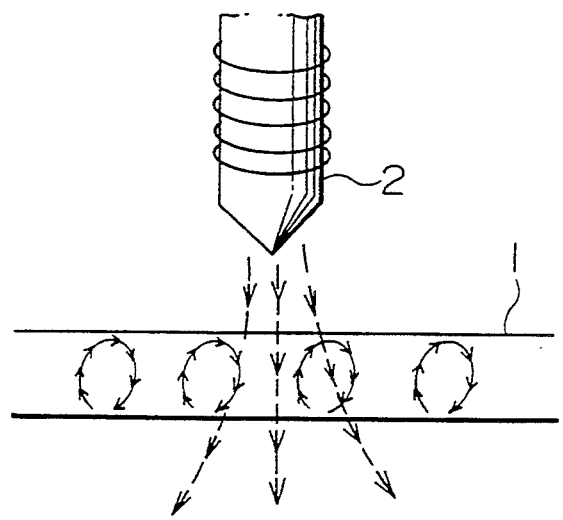
FIG. 2 conceptionally shows a principle on how a pulse voltage is developed across a magnetic wire circumferentially magnetized therein.
Figure 3A:
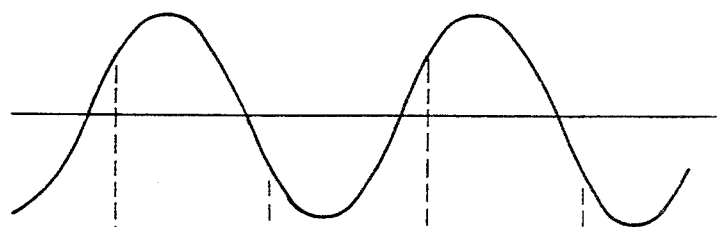
FIGS. 3A and 3B are waveforms of an A.C. magnetic field and a pulse voltage generated on the above principle respectively.
Figure 3B:
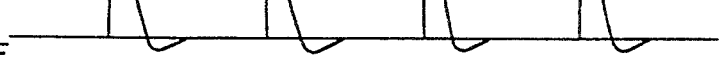

FIG. 2 shows a pulse-voltage generating principle for explaining how to generate the pulse voltage when the circumferentially-magnetized magnetic wire 1 is subjected to an A.C. magnetic field. The circumferential magnetization of the magnetic wire 1 is repetitively subjected to partial inverting and restoring movements under the influence of the alternating magnetic field of the coordiante designating electromagnet 2. The magnetic field of the electromagnet and the then pulse voltage developed across the magnetic wire are shown in FIGS. 3A and 3B. More specifically, the number of inversions in the magnetization varies depending on the composite value of the magnetic field generated by the electromagnet and the magnetic field based on terrestrial magnetism. The frequency components of the voltage developed across the magnetic wire include composite values of the respective frequency components of 1f, 2f, 3f, . . . where f denotes a frequency at which the electromagnet is excited.

Among these frequency components, the 1f component varies largely with the alternating magnetic field, but the 2f component less varies, since the 2f component is derived from pulses having the same waveform as will be appreciated from FIG. 3B. For this reason, it is effective to detect the 2f component by the pulse voltage occurring in the magnetic wire and therefore the double-frequency detecting circuit 5 in FIG. 1 is arranged to detect the 2f component.

In order to provide a circumferential magnetization to the magnetic wire, there is employed a method of supplying a D.C. current to the magnetic wire to provide thereto a magnetization caused by a magnetic field based on the right-hand rule because of its ease. To this end, the D.C. bias circuit 4 is used. The circuit 4 can control of the quantity of the aforementioned D.C. current. Further, by increasing the current supplied to the magnetic wire, the influence of the external magnetic field such as terrestrial magnetism can be made less.

Figure 4:
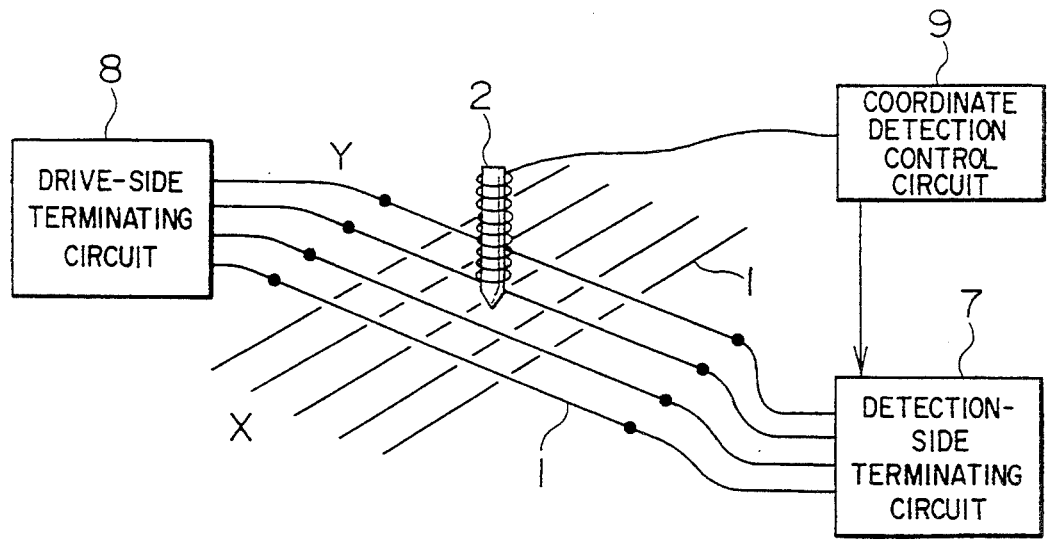
FIG. 4 shows a concept of a coordinate input device in accordance with the present invention.

Conceptionally shown in FIG. 4 is a coordinate input device wherein the detection section of FIG. 1 is arranged in the form of an X-Y matrix. More in detail, in order to detect a position of the coordinate designating electromagnet 2, a plurality of the magnetic wires 1 are provided in X and Y directions. Though only a Y-direction voltage detector for the magnetic wire 1 has been illustrated in FIG. 4, an X-direction voltage detector having the same function as the Y-direction voltage detector is also provided in actual applications. A detection-side terminating circuit 7, which has the same function as the A.C. high impedance circuit 3 in FIG. 1, including a signal multiplexing circuit for sequentially guiding pulse signals from the respective Y-direction magnetic wires 1 to the detection circuit as well as the double-frequency detecting circuit. A drive-side terminating circuit 8 includes such a D.C. current bias circuit 4 and an A.C. high impedance circuit 3 connected to the circuit 4 as necessary as shown in FIG. 4. A coordinate detection control circuit 9 acts to excite the electromagnet 2 for coordinate designation and also to generate a timing signal for controlling the function of the double-frequency detecting circuit and the function of the multiplexing circuit. The structures of these circuits will be detailed later.

As has been explained above, the coordinate input device detects voltages developed (when the circumferential-magnetization of the magnetic wires is inverted) in ones of the circumferentially-magnetized magnetic wires when the coordinate designator excited with an A.C. current approaches thereto. Such a coordiante input device is effective because it is based on a new detection principle that the magnetic wires as coordinate detectors require no windings or the like for voltage generation. However, since a voltage is developed between both ends of the magnetic wire, when a multiplicity of magnetic wires for coordinate detection are arranged in the form of an array, the both ends of each magnetic wire is spaced by a relatively long distance. For this reason, a signal return path for connecting the both ends of the magnetic wire is necessary. When the signal return path is provided in an outer frame part, electromagnetic coupling between the external magnetic field and a loop coil comprising the magnetic wire and the return path causes generation of a coupling signal, in addition to the original coordiante detection signal caused by the inversion in the magnetization of the magnetic wire. In the event where the magnetic wire is made thin, the coupling signal becomes larger than the voltage component caused by the invention in the circumferential magnetization of the magnetic wire, which results in reduction of S/N ratio of the coordiante detection signal.

In order to minimize the electromagnetic coupling of the loop coil of the coordinate detector and the return path with the external magnetic field, a method for making small the area of the loop coil is effectively employed. This enables reduction of the noise in the detection voltage caused by the electromagnetic coupling. Further, when the return path is also made in the form of the same magnetic wire, the magnetization reversal signal is added to the voltages generated by the magnetic wires of the go and return paths on the detection principle of the circumferentially magnetized magnetic wire, whereby the detection voltage can be obtained which corresponds to twice the detection voltage obtained when the go path is made in the form of a magnetic wire and the return path is made in the form of an ordinary conductor. This case will be detailed in connection with an embodiment shown in FIGS. 5 and 6.

Figure 5:
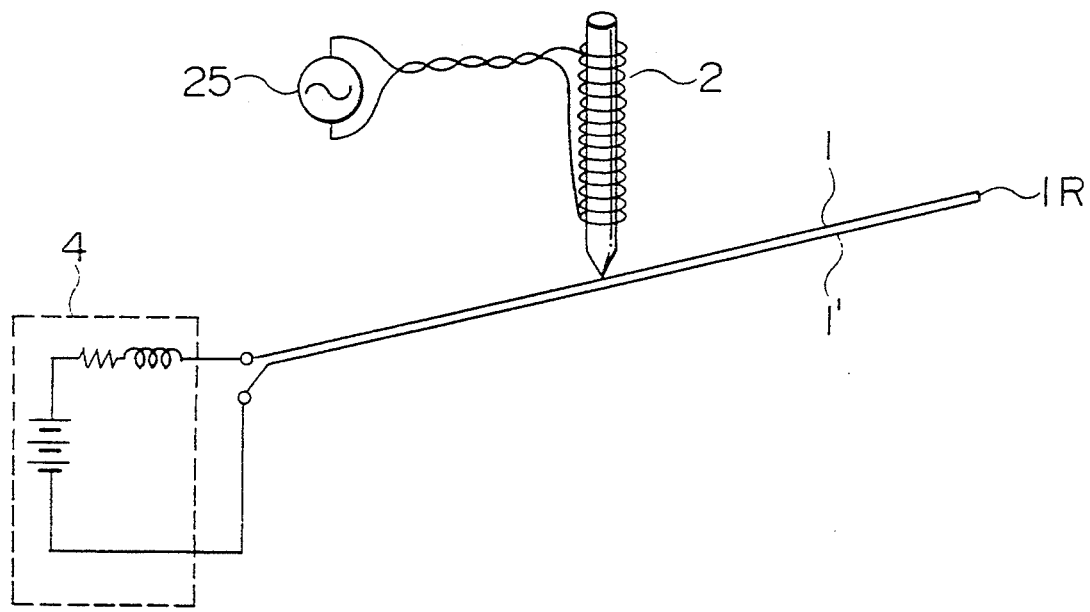
FIG. 5 shows a conceptional basic arrangement of another embodiment of the present invention for explaining its coordinate detecting operation.
Figure 6:
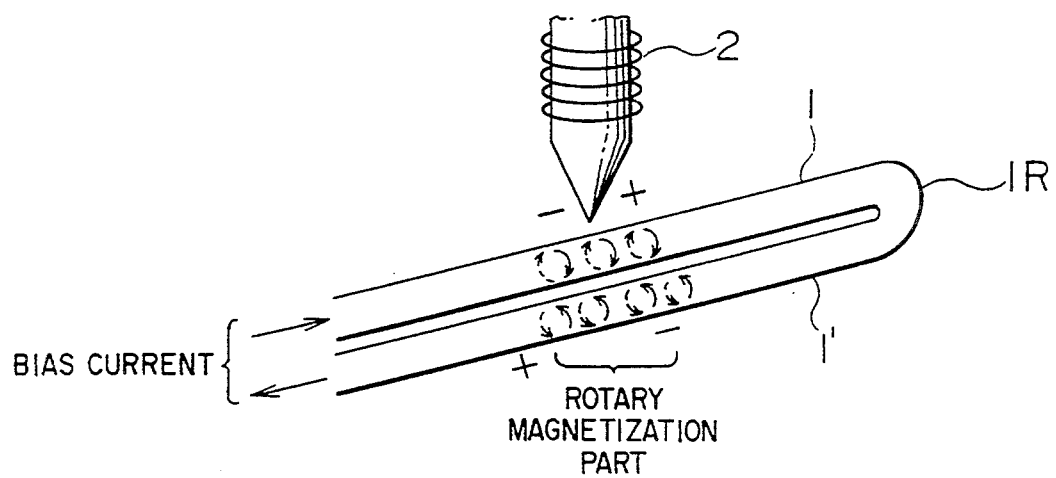
FIG. 6 is a diagram for explaining how the circumferential magnetization of a magnetic wire is rotated by an external magnetic field.

In FIG. 5, the magnetic wire 1 as a go path is connected at a fixed turn point 1R to a magnetic wire 1' as a return path. The D.C. bias circuit 4 is used to provide circumferential magnetization to the both wires. The coordinate designator 2 excited by an A.C. signal source 2S applies an A.C. magnetic field to the both magnetic wires. The operational principle of the coordiante detector is shown in FIG. 6, wherein a bias current shown by arrows causes such circumferential magnetization as shown in FIG. 6 to be developed in the interiors of the magnetic wires 1 and 1' of the go and return paths. When the magnetic field generated by the coordinate designator 2 causes rotation of the magnetization direction of the wires, a voltage is developed by a change in the magnetic flux of the rotary magnetization part of each wire with such polarities as shown in FIG. 6. Thus, the voltages developed in the respective wires are added together and therefore a generation voltage in this embodiment is doubled when compared to the case of use of the single magnetic wire. Since the turn path 1R between the magnetic wires 1 and 1' of the go and return paths are minimized to dispose the wires as close to each other as possible, the area of a loop coil constituted of the both wires can be made small. For this reason, a voltage caused by electromagnetic coupling other than the detection voltage caused by the rotary magnetization can be suppressed down to a low level.

Figure 7:
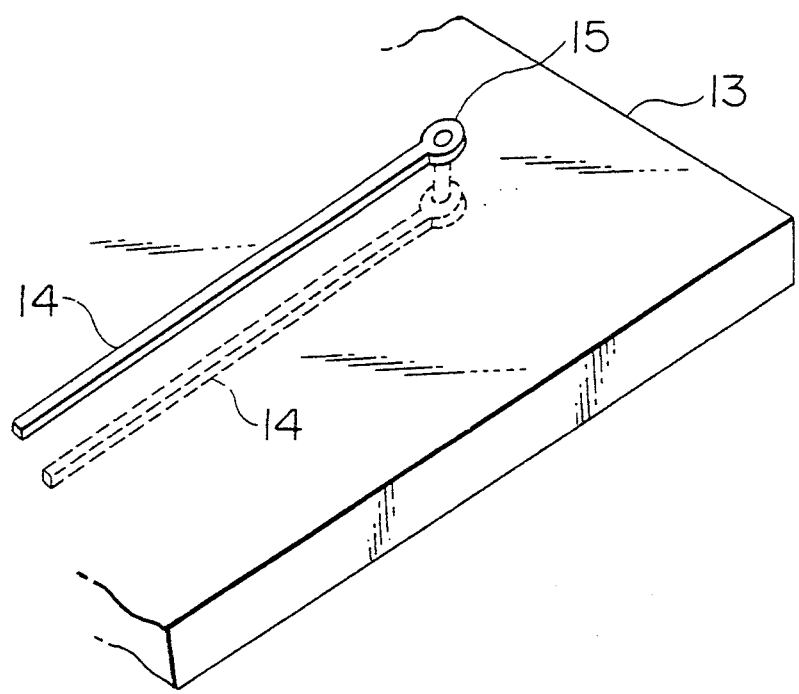
FIG. 7 is a diagram showing how magnetic materials are fixed onto a substrate.

Shown in FIG. 7 is another embodiment in which magnetic materials 14 each in the form of a thin magnetic wire pattern is bonded or deposited as fixed onto the front and back surfaces of a substrate 13. A through hole 15 made in the substrate 13 is for interconnection between the patterns provided on the front and back sides of the substrate. When it is desired to form very thin magnetic patterns, this can be realized by depositing a magnetic film on each of the entire front and back sides of the substrate and then etching the substrate to leave the thin magnetic patterns 14 thereon. When it is desired to provide such magnetic patterns both in X and Y directions, this can be realized by constructing the substrate in the form of a multiple layer.

Figure 8:
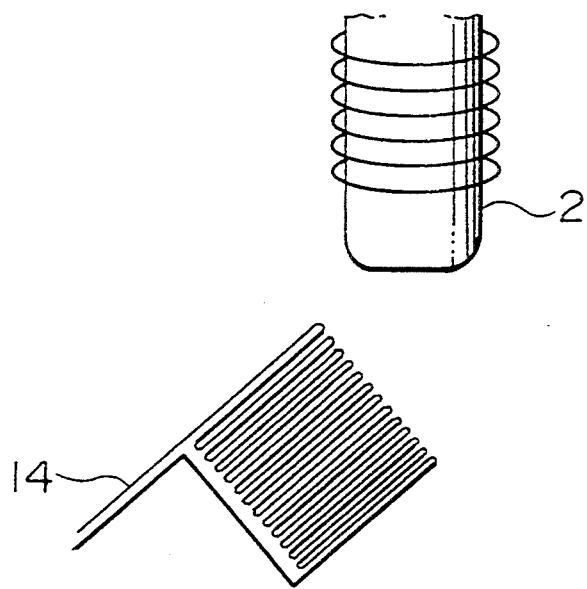
FIG. 8 shows the concept of a high-sensitivity sensor for measuring a vertical distance between an electromagnet and a magnetic wire pattern.

FIG. 8 shows another embodiment wherein the magnetic material 41 is made in the form of a thin magnetic pattern of repetitive magnetic lines to add together detection voltages developed in the magnetic lines to obtain a high total detection voltage and thus a high sensitivity. With such an arrangement, there can be realized a proximity sensor which detects a vertical distance with respect to the coordinate designator 2 with a high sensitivity. It goes without saying that such a thin magnetic pattern 14 of repetitive magnetic lines as shown in FIG. 8 may be replaced by a single wire as necessary to form the proximity sensor.

The magnetic wire or magnetic material mentioned above may be made of preferably material having a negative magnetostrictive coefficient such as amorphous material.

Figure 9:
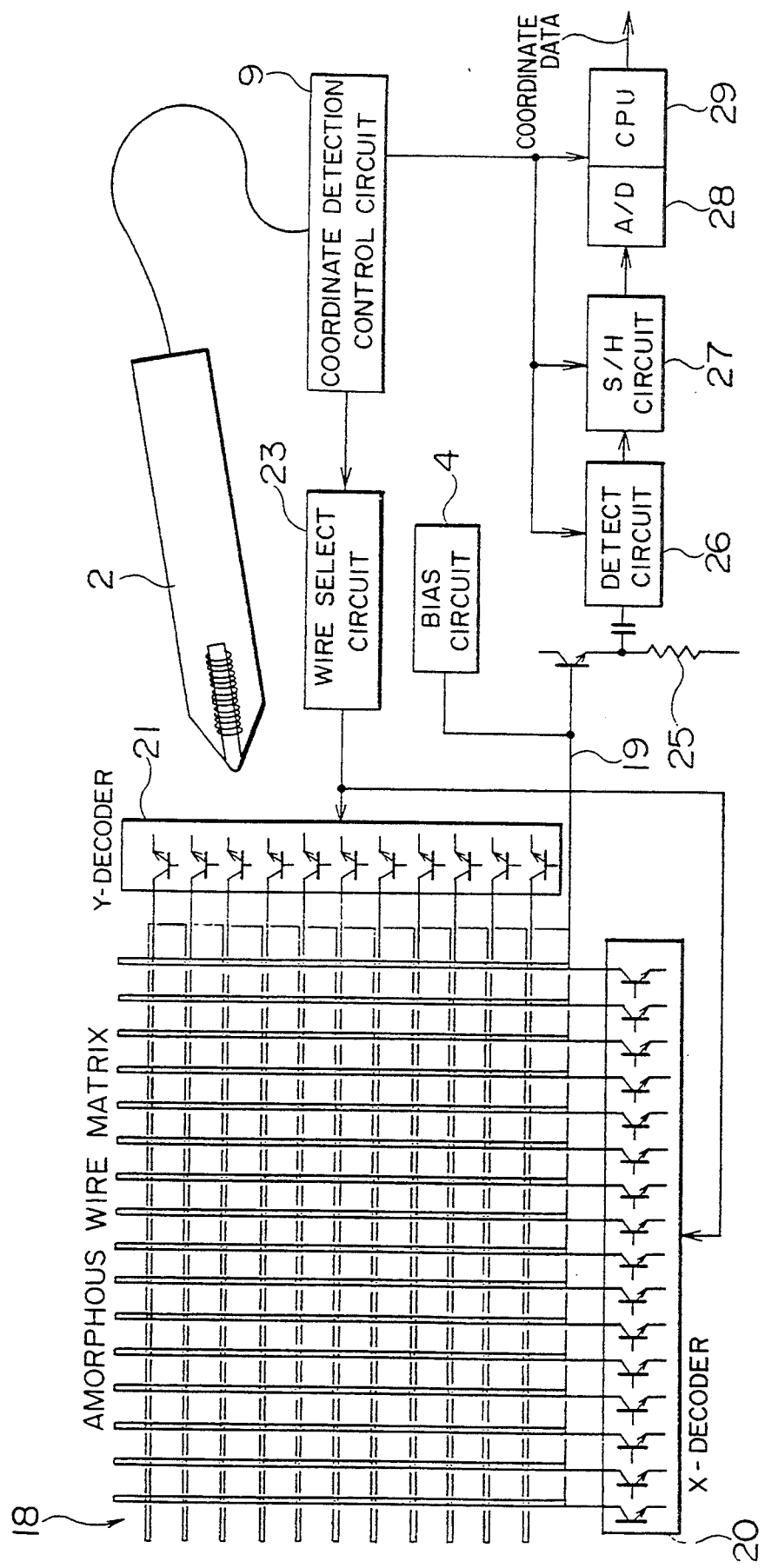
FIG. 9 is a block diagram of a general arrangement of a coordinate input device of the present invention.

Detailed explanation will next be made as to the coordinate input device by referring to a block diagram of FIG. 9. In the drawing, reference numeral 18 denotes a matrix of repetitively turned magnetic wires arranged as equi-spaced in X and Y directions. One ends of all the magnetic wires are connected through a line 19 to the D.C. bias circuit 4 which supplies a constant current; while the other ends of all the magnetic wires are connected to collectors of switching transistors of X- and Y-decoders 20 and 21. The switching transistors are also connected at their emitters to a common circuit part.

A wire selection circuit 23 supplies a switching signal to the bases of the switching transistors of the X- and Y-decoders 20 and 21 to sequentially turn ON the transistors one after another and to sequentially switch ON the wires one after another to sequentially supply a bias current thereto.

A coordinate detection control circuit 9 supplies a timing pulse for wire selection to the wire selection circuit 23 and also supplies an A.C. current to the coordinate designator 2 to generate an A.C. magnetic field therein.

When the coordinate designator 2 is approached to the matrix 18 and when one of the magnetic wires close to the coordinate designator 2 is supplied with the bias current via the decoder, such a pulse voltage as shown in FIG. 3B appears on the line 19. The pulse voltage is sent through a resistor/capacitor coupling circuit 25 to a detection circuit 26 to be detected thereat. Subsequently, the pulse voltage is sample-held at a sample/hold circuit 27, converted into a digital signal at an A/D covnerter 28, subjected to a signal processing at a CPU 29, and then transmitted to a host computer (not shown) as a coordinate data.

Figure 10:
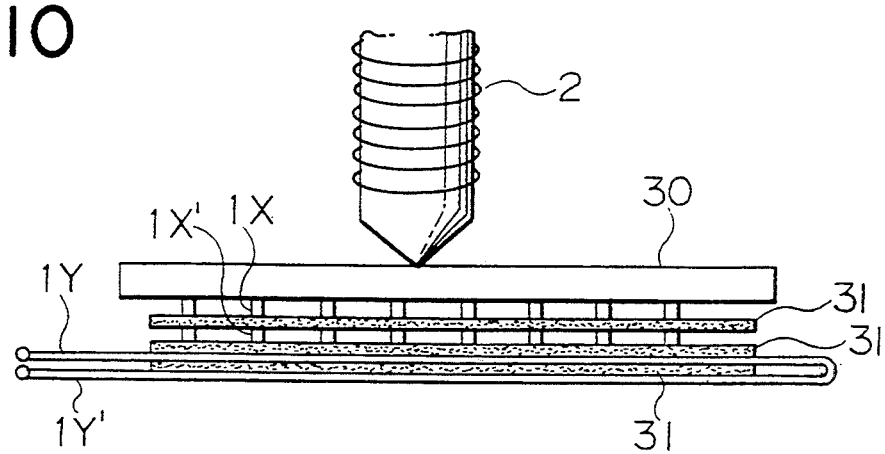
FIG. 10 is a cross-sectional view of a coordinate detector showing the structure of an array of magnetic wires arranged in X and Y directions.

The wire matrix, more in detail, is constructed so that, as shown in FIG. 10, magnetic wires 1X and 1X' for detection of X-direction coordinate magnetic wires 1Y and 1Y' for detection of Y-direction coordinate are arranged at regular intervals on a panel 30 which acts to stabilize a vertical distance between the coordinate designator 2 and the magnetic wires and also to fixedly mount the magnetic wires thereto. The wires 1X, 1X' and 1Y, 1Y' are arranged as bent or turned as shown in FIGS. 5 and 6 respectively, and an insulator 31 is disposed between the associated wires to avoid any short-circuiting of the generation voltage caused by the rotary magnetization. Further, another insulator 31 is disposed between the X- and Y-direction wires.

With the present coordinate input device, a multiplicity of magnetic wires are arranged in the X and Y directions to generate detection outputs indicative of a distance between the coordinate designator and ones of the wires close to the designator, so that the detection outputs of the associated magnetic wires made high when subjected to the A.C. magnetic field of the coordinate designator are used to carry out a coordinate estimation computation. Thus, even when the X- and Y-direction coordinate detectors are arranged at intervals of, for example, 10 mm, the coordinate input device can have a resolution of 0.1 mm. This computation is carried out in the CPU 29 in FIG. 9.

Figure 11:
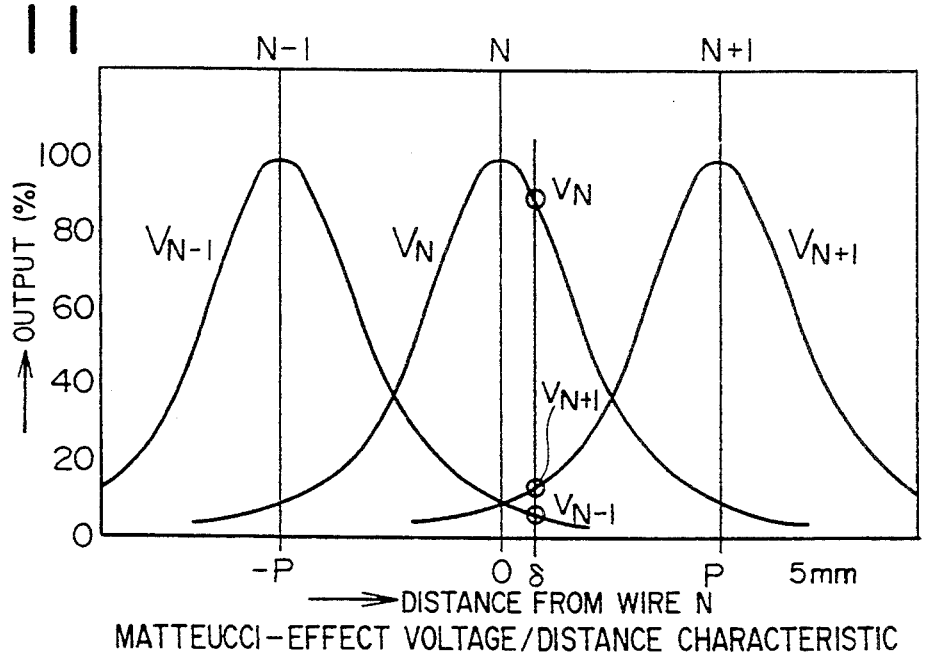
FIG. 11 is a characteristic diagram showing relationships between Matteucci-effect voltages developed across adjacent wires and distances from the centers of the respective wires.

FIG. 11 shows Matteucci effect voltage characteristics $V_{N-1}$, $V_N$, and $V_{N+1}$ detected across three wires $N-1$, N, and $N+1$ when the coordinate designator is positioned at points spaced by a distance S from the centers of these wires, respectively. In the illustrated example, the distance between the wires is set to be 5 mm.

Figure 12:
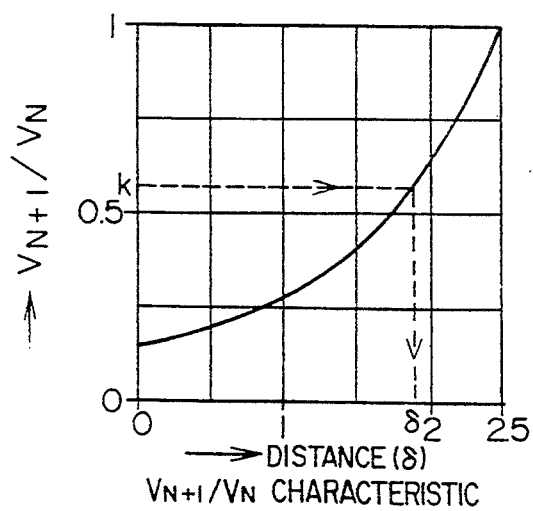
FIG. 12 is a characteristic diagram showing a relationship between the distance and a ratio between voltages detected across the adjacent wires.

When the coordinate designator is located between the wires N and $N+1$ and closer to the wire N as shown in FIG. 11, voltages $V_N$, $V_{N+1}$, and $V_{N-1}$ are detected across the wires N, $N+L$, and $N-1$ respectively. In this case, since the voltage $V_N$ has the largest value and the voltage $V_{N+1}$ has the next largest value among these voltages $V_N$, $V_{N+1}$, and $V_{N-1}$, these two voltages $V_N$ and $V_{N+1}$ are employed and the smaller voltage $V_{N+1}$ is divided by the larger voltage $V_N$ to obtain a value of $V_{N+1}/V_N$. The obtained value $V_{N+1}/V_N$ satisfies such a characteristic with respect to a distance $\delta$ from the wire center as shown in FIG. 12. More specifically, the value $V_{N+1}/V_N$ becomes minimum on the wire N ($\delta=0$) and becomes larger as the position of the coordinate designator shifts rightwardly from the wire N and when the coordinate designator reaches a point ($\delta=2.5$) between the wires N and $N+1$, the value becomes 1. The shape of the characteristic of FIG. 12 is identical or symmetrical with respect to each wire position in the left and right directions. Accordingly, when the characteristic is previously stored in a memory of the CPU 29, the position $\delta$ of the coordinate designator from the wire N producing the largest detection voltage can be calculated on the basis of the ratio ($V_{N+1}/V_N$) between the detection voltages of the wire N and adjacent wire $N+1$ respectively having the largest and the next largest values in the detection voltages of the wires, and then a coordinate point indicate of the coordinate designator can be calculated on the basis of the position $\delta$.

Figure 13:
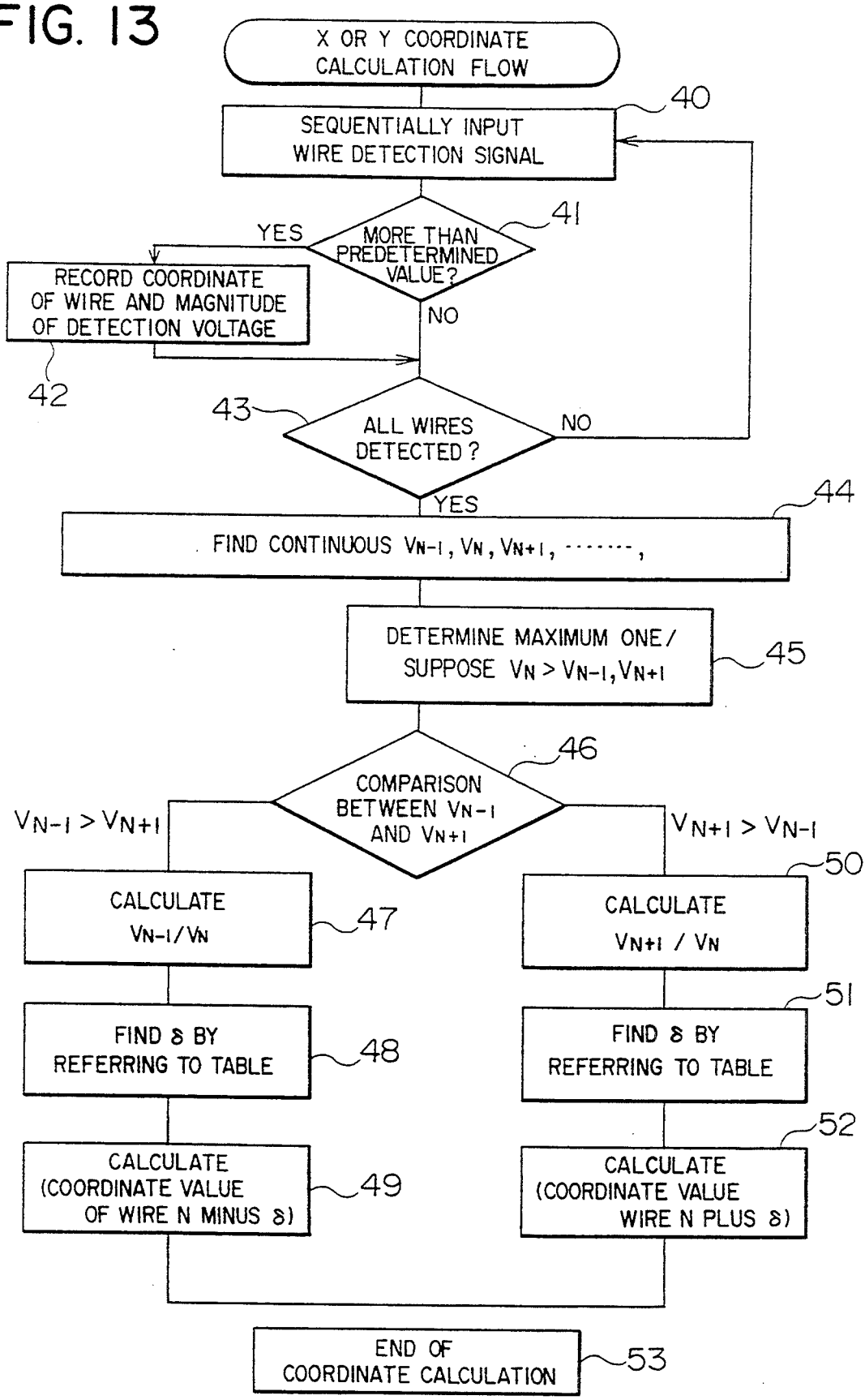
FIG. 13 is a flowchart showing the coordinate calculation procedure of the coordinate input device.

The above calculation procedure will be explained by referring to a flowchart of FIG. 13. In the drawing, first, a detection signal is input from a wire in a step 40 and it is judged in a step 41 whether or not the input signal is larger than a predetermined value. Determination of NO in the step 41 causes control to proceed to a step 43. Determination of YES in the step 41 causes control to go to a step 42 where the coordinate valus of the wire and the size of the detection signal are recorded in the memory and control goes to the step 43. In the step 43, it is judged whether or not detection of all the wires has been completed. Determination of NO in the step 43 causes control to go back to the step 40 to input the detection signal of the next wire. Determination of YES, on the other hand, causes control to proceed to a step 44 to find detection signals $V_{N-1}$, $V_N$, $V_{N+1}$, ... which have been judged as having predetermined continuous values. In a next step 45, one of these detection signals having a maximum value, for example, the signal $V_N$ is determined.

Subsequently, comparison is made in a next step 46 between the detection signals $V_{N-1}$ and $V_{N+1}$ of the wires $N-1$ and $N+1$ adjacent to the wire N which produced the maximum detection signal. When the comparison result satisfies a relation $V_{N-1} > V_{N+1}$, control goes to a step 47 to calculate a value $V_{N-1}/V_N$. In a next step 48, a value $\delta$ is found by referencing a table (stored in the memory) having the characteristic as shown in FIG. 12. In a next step 49, the value $\delta$ is subtracted from the coordinate value of the wire N and then a coordinate point at which the coordinate designator is positioned is calculated.

If the comparison result in the step 46 satisfies a relation $V_{N+1} > V_{N-1}$, then control proceeds to a step 50 to calculate a value $V_{N+1}/V_N$. In a next step 51, the value $\delta$ is found by referencing the table according to the calculated value $V_{N+1}/V_N$. After this, in a step 52, the value $\delta$ is added to the coordinate value of the wire N to find a coordinate point indicative of the position of the coordinate designator. In a step 53, the coordinate calculation is completed.

Although the aforementioned coordinate calculation has been explained in connection with a single coordinate axis, the same explanation holds true for the coordinate calculation of the other coordiante axis with use of the similar flowchart.

Explanation will be made as to yet a further embodiment. In the present embodiment, when circumferential magnetization is generated in a magnetic wire having a magnetostrictive coefficient of from zero to a negative value and when an exciting magnetic field caused by an exciting coil is applied to the magnetic wire, a pulse voltage is generated across the wire at the time that the circumferential magnetization is inverted. At this time, if an external magnetic field other than the exciting magnetic field is present, then the pulse voltage at the time of the magnetization reversal is influenced by both of the exciting magnetic field and the external magnetic field. Thus, when the exciting magnetic field is previously set at a predetermined value, the intensity of the external magnetic field can be detected. Further, in the case where a plurality of exciting coils are arranged along a magnetic wire so that a switch enables sequential change-over of the exciting coils, an external magnetic field in the vicinity of associated one of the exciting coils can be detected, whereby a magnetic image sensor can be realized.

Provision of the circumferential magnetization to a magnetic wire having a magnetostrictive coefficient of zero to a negative value can be realized by providing a suitable twist to the magnetic wire to give it a twisting stress.

In the event where provision of the circumferential magnetization to a magnetic wire having a magnetostrictive coefficient of zero to a negative value is realized by providing a twist to the magnetic wire, when the external magnetic field exceeds a predetermined value, this causes inversion of the magnetization, at which time a voltage proportional to $-d\phi/dt$ is generated, where $\phi$ denotes magnetic flux. Accordingly, an A.C. magnetic field is applied to the magnetic wire, a pulse voltage at the time of the magnetization inversion is developed across the magnetic wire. Under such a condition, if a magnetic field other than the magnetic field caused by the exciting coil in the vicinity of the magnetic wire is present, then a composite magnetic field of the both magnetic fields is applied to the magnetic wire so that the composite magnetic field causes inversion of the magnetization in the interior of the magnetic wire. In other words, the external magnetic field acts as a modulation signal when the exciting magnetic field is considered to be a carrier, and thus separate detection of the external magnetic field can be realized by processing the signal caused by the magnetization inversion. Detection of the external magnetic field can be attained with a high resolution by narrowing the range of the exciting magnetic field and this can be realized with use of a ferrite core wound by a winding.

Figure 14:
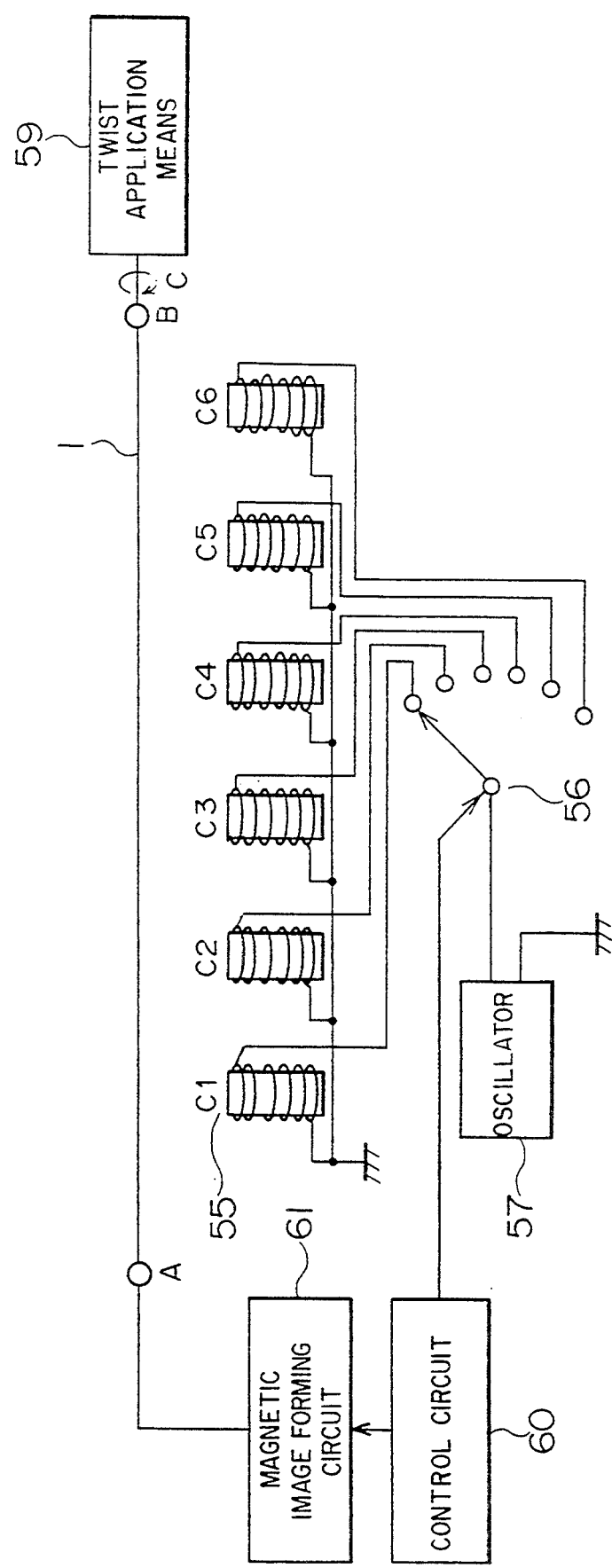
FIG. 14 is an arrangement of a magnetic image sensor in accordance with the present invention.

An arrangement of the magnetic image sensor in accordance with the present embodiment is shown in FIG. 14. The magnetic image sensor comprises a magnetic wire 1 as a detector, one or more exciting coils 55 for providing a local exciting magnetic field to the wire 1, a change-over switch 56 for switchingly supplying an exciting current to one of the exciting coils, and an oscillator 57 for supplying the exciting current to the switch 56.

Figure 15:
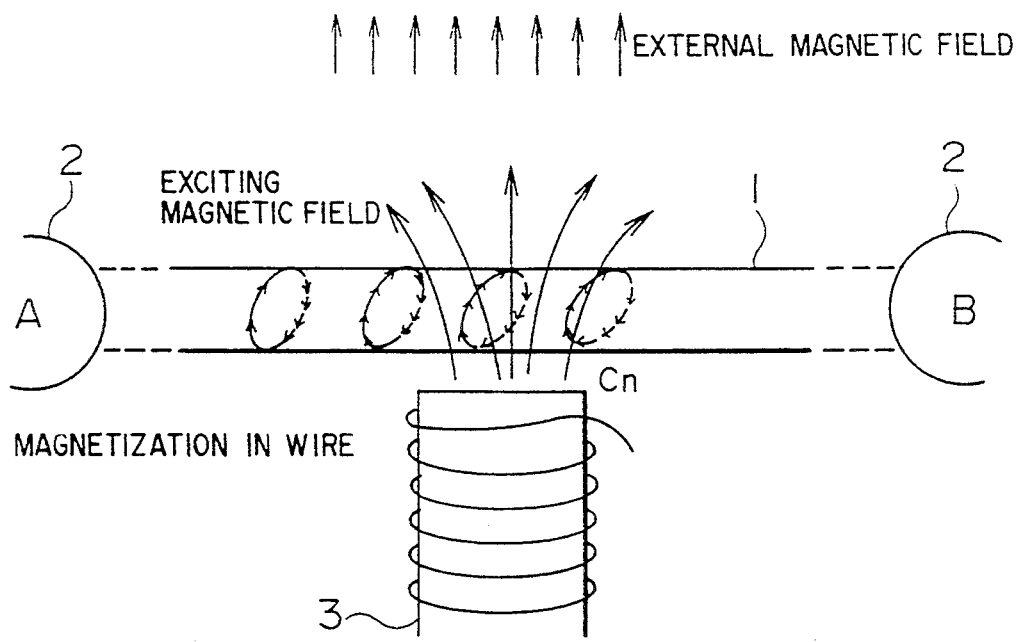
FIG. 15 conceptionally shows a detection unit of the magnetic image sensor.

A detection unit of the magnetic image sensor of FIG. 14 is shown in FIG. 15, in which case circumferential magnetization takes place within the interior of the magnetic wire 1.

In this case, the exciting magnetic field of the exciting coil 55 causes inversion of the interior magnetization direction, whereby a pulsative voltage is developed between terminals A and B of the magnetic wire 1. Pulses occur in the detection signal at a predetermined phase of the exciting current, i.e., the exciting magnetic field. Under such a condition, when an external magnetic field other than the exciting magnetic field is present, the external magnetic field causes the magnetization in the interior of the magnetic wire 1 to have been partially reversed in direction, which partial part of the magnetic wire, when subjected to application of the exciting magnetic field, does not contribute to generation of the pulse voltage between the terminals A and B. In other words, the magnitude of the detection signal is modulated by the external magnetic field. The pulse voltage is developed across the magnetic wire 1 on such a principle as mentioned above. A control circuit 60 controls the switching operation of the change-over switch 56 and also controls a magnetic image forming circuit 61 which detects the magnitude of the pulse voltage developed across the wire 1 and which forms a magnetic image. Only that part of the magnetic wire 1 excited by associated one of the respective exciting magnetic fields of the exciting coils 55 is modulated by the external magnetic field, and thus the other parts not excited by the exciting magnetic field will not affect the pulse signal at all. For this reason, when a multiplicity of such exciting coils 55 are arranged along a magnetic wire, a magnetic image sensor can be increased in resolution. The exciting coils 55 may be realized not only by ferrite core rods wound by windings but also by a pattern (in a helical or other shape) formed on a substrate in the form of copper-clad multi-laminates. Since the multiplicity of exciting coils 55 are arranged to be sequentially excited, that part of the wire which can detect the external magnetic field is moved along the length of the wire, whereby the magnetic image sensor can be realized. Since the design exciting current of the exciting coil is below several ten mA, an ordinary analog switch or the like may be used as the changeover switch 56.

Figure 16:
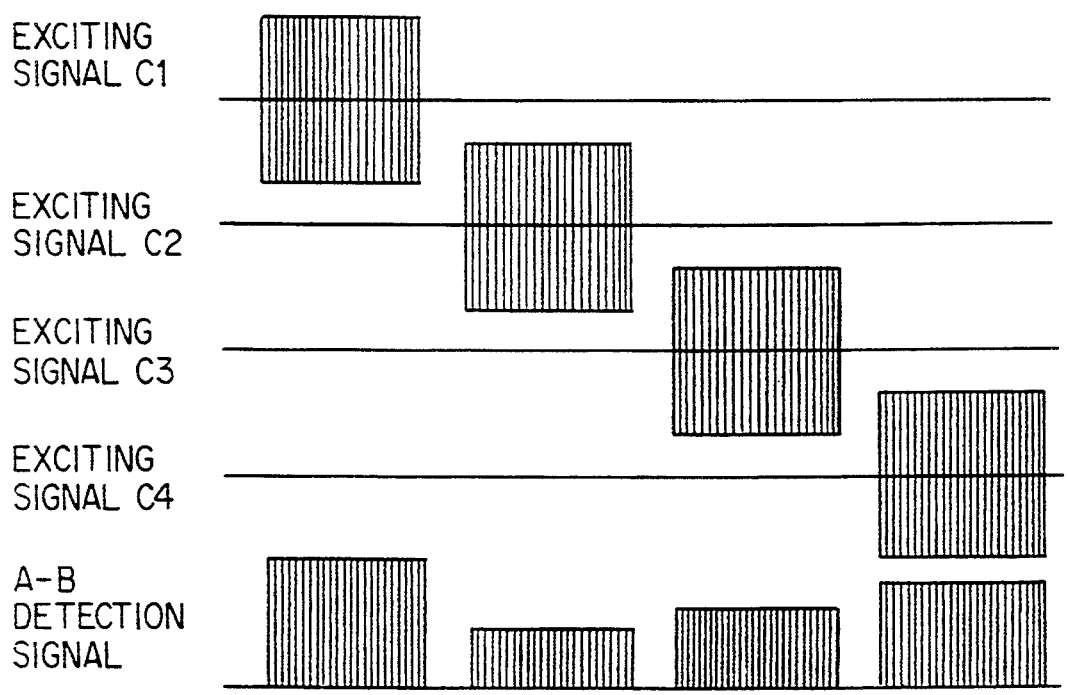
FIG. 16 is a timing chart showing the timing of exciting signals and A-B detection signal in the magnetic image sensor.

Referring to FIG. 16, there are shown operational signals of the magnetic image sensor of FIG. 14. In FIG. 16, reference symbols C1 to C4 denote exciting signals for the exciting coils C1 to C4 which signals are sequentially switched as illustrated.

In the illustrated example, the detection signal is subjected to a modulation by the external magnetic field in the vicinity of the respective exciting coils and appears as such a detection signal having a modulated amplitude as an A-B detection signal in FIG. 16.

In the case where the magnetic wire is made of material having a magnetostrictive coefficient of zero to a negative value, circumferential magnetization tends to easily occur and the magnetization is stabilized by applying a twist to the wire at a rate of about one turn/10 cm from a twist application means 59 as shown by an arrow C in FIG. 14. In this connection, the application of the twist to the wire may be replaced by the supply of a bias current thereto or the bias current may be supplied to the wire in addition to the twist.

In accordance with the present embodiment, there can be realized a magnetic image sensor which can realize a wide range of detection with a necessary resolution while eliminating the need for precise winding operations, precise processing of magnetic cores and semicondcutor techniques. Further, the structure of the present invention can be made highly simple when compared with the prior art and thus its cost can be easily reduced. In addition, since the present invention is based on the still reading principle, the invention can be independent of the moving speed of a detection medium.

What is claimed is:

1. A magnetic detector based on Matteucci effect, comprising:
    at least one magnetic wire;
    means for providing circumferential magnetization to said magnetic wire;
    means for generating an A.C. magnetic field;
    means for detecting a Matteucci-effect voltage developed across the magnetic wire when a relative distance between said magnetic wire and said A.C. field generation means becomes small;
    means for detecting proximity between said magnetic wire and said A.C. field generation means when said Matteucci-effect voltage detected by said detection means is equal to or higher than a predetermined value;
    wherein said magnetic wire is made of go and return line paths disposed close to each other.

2. A magnetic detector as set forth in claim 1, wherein said magnetic wire is made of a plurality of go and return line paths disposed close to each other.

3. A magnetic detector based on Matteucci effect, comprising:
    at least one magnetic wire;
    means for providing circumferential magnetization to said magnetic wire;
    means disposed close to said magnetic wire for generating at least one A.C. magnetic field;
    means for detecting a Matteucci-effect voltage developed across the magnetic wire by mutual reaction between said magnetic wire and said A.C. field generation means;
    means, when said Matteucci-effect voltage detected by said detection means is varied under influence of a proximity static magnetic field to be detected, for detecting proximity between said magnetic wire and said static magnetic field under detection;
    wherein said magnetic wire is made of go and return line paths disposed close to each other.

4. A magnetic detector as set forth in claim 3, wherein said magnetic wire is made of a plurality of go and return line paths disposed close to each other.

5. A magnetic image sensor based on Matteucci effect, comprising:
    at least one magnetic wire;
    means for providing circumferential magnetization to said magnetic wire;
    a plurality of means disposed along a length direction of the magnetic wire for generating a plurality of A.C. magnetic fields;
    constant A.C. power supply source;
    switch means for supplying a current from said constant power supply source to said plurality of A.C. field generation means sequentially one after another;
    means for detecting a Matteucci-effect voltage developed across said magnetic wire by mutual reaction between the magnetic wire, said A.C. field generation means and a static magnetic field to be detected; and
    means for forming an image of the static magnetic field based on a modulation signal into which said Matteucci-effect voltage detected by said detection means is modulated by said static magnetic field to be detected.

6. A magnetic detector based on Matteucci effect, comprising:
    at least one magnetic wire;
    means for providing circumferential magnetization to said magnetic wire;
    means for generating an A.C. magnetic field;
    means for detecting a Mattteucci-effect voltage developed across said magnetic wire when a relative distance between said magnetic wire and said A.C. field generation means becomes small; and
    means for detecting proximity between said magnetic wire and said A.C. field generation means when said Matteucci-effect voltage detected by said detection means is equal to or higher than a predetermined value;
    wherein said circumferential magnetization means is means for supplying a D.C. current to said at least one magnetic wire.

7. A magnetic detector as set forth in claim 6, wherein said at least one magnetic wire includes plurality of magnetic wires and said means for supplying D.C. current supplies said D.C. current to each of said magnetic wires.

8. A magnetic detector as set forth in claim 6, wherein said magnetic wire is made of go and return line paths disposed close to each other.

9. A magnetic detector as set forth in claim 6, wherein said magnetic wire is made of a plurality of go and return line paths disposed close to each other.

10. A magnetic detector based on Matteucci effect, comprising:
   at least one magnetic wire;
   means for providing circumferential magnetization to said magnetic wires;
   means disposed close to said magnetic wire for generating at least one A.C. magnetic field;
   means for detecting a magnetic Matteucci-effect voltage developed across said magnetic wire by mutual reaction between said magnetic wire and said A.C. field generation means; and
   means, when said Matteucci-effect voltage detected by said detection means is varied under influence of a proximity static magnetic field to be detected, for detecting proximity between said magnetic wire and said static magnetic field under detection;
   wherein said circumferential magnetization means is means for supplying a D.C. current to said at least one magnetic wire.

11. A magnetic detector as set forth in claim 10, wherein said at least one magnetic wire includes a plurality of magnetic wires and said means for supplying D.C. current suplies said D.C. current to each of said magnetic wires.

12. A magnetic detector as set forth in claim 10, wherein said magnetic wire is made of go and return line paths disposed close to each other.

13. A magnetic detector as set forth in claim 10, wherein said magnetic wire is made of a plurality of go and return line paths disposed close to each other.

14. A magnetic image sensor as set forth in claim 5, wherein said magnetic wire is made of material having a magnetostrictive coefficient of zero to a negative value.

15. A magnetic image sensor as set forth in claim 14, wherein said circumferential magnetization means is means for applying a twist to said magnetic wire.

16. A magnetic image sensor as set forth in claim 15, wherein said twist application means applies a twist to said magnetic wire at a rate of about one turn/10 cm.

17. A magnetic image sensor as set forth in claim 15, wherein said circumferential magnetization means is means for supplying a D.C. current to said magnetic wire.

18. A magnetic image sensor as set forth in claim 5, wherein said circumferential magnetization means is means for supplying a D.C. current to said magnetic wire.

19. A magnetic image sensor as set forth in claim 5, wherein said magnetic wire is made of go and return line paths disposed close to each other.

20. A magnetic image sensor as set forth in claim 19, wherein said magnetic wire further includes insulation means for avoiding electrical contact between the go and return line paths thereof.

21. A magnetic image sensor as set forth in claim 5, wherein each of said plurality of A.C. magnetic field generation means includes a ferrite core rod and a winding wound onto said ferrite core rod.

22. A magnetic image sensor as set forth in claim 21, wherein said winding is formed on a substrate in the form of multi-laminates.

* * * * *